(12) United States Patent
Lee et al.

(10) Patent No.: US 9,437,621 B2
(45) Date of Patent: Sep. 6, 2016

(54) METHOD OF MANUFACTURING COMPONENTS OF DISPLAY PANEL ASSEMBLY FROM SAME MOTHER SUBSTRATE

(71) Applicant: Samsung Display Co., Ltd., Yongin-Si, Gyeonggi-Do (KR)

(72) Inventors: Sang-myoung Lee, Seoul (KR); Osung Seo, Seoul (KR); Seungjun Yu, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/946,936

(22) Filed: Nov. 20, 2015

(65) Prior Publication Data

US 2016/0204127 A1 Jul. 14, 2016

(30) Foreign Application Priority Data

Jan. 12, 2015 (KR) .................... 10-2015-0004128

(51) Int. Cl.
| | |
|---|---|
| *H01J 1/02* | (2006.01) |
| *H01L 27/12* | (2006.01) |
| *H01L 29/786* | (2006.01) |
| *G02F 1/1368* | (2006.01) |
| *G02F 1/1335* | (2006.01) |
| *G02F 1/1341* | (2006.01) |

(52) U.S. Cl.
CPC ........... *H01L 27/124* (2013.01); *G02F 1/1341* (2013.01); *G02F 1/1368* (2013.01); *G02F 1/133516* (2013.01); *H01L 27/1222* (2013.01); *H01L 29/78663* (2013.01)

(58) Field of Classification Search
CPC ............. H01L 27/124; H01L 27/1222; H01L 29/78633

USPC ....................................................... 438/23, 30
See application file for complete search history.

(56) References Cited

U.S. PATENT DOCUMENTS

| | | | |
|---|---|---|---|
| 6,781,064 B1 | 8/2004 | Appelt et al. | |
| 8,956,900 B2 * | 2/2015 | Kwon | G02F 1/1345 438/30 |
| 2004/0009291 A1 | 1/2004 | Lee | |
| 2007/0248747 A1 | 10/2007 | Lin | |
| 2010/0176712 A1 * | 7/2010 | Seon | H01J 31/127 313/496 |
| 2014/0066545 A1 | 3/2014 | Moon et al. | |
| 2015/0285964 A1 * | 10/2015 | Yim | G02B 5/0294 359/599 |

FOREIGN PATENT DOCUMENTS

| | | |
|---|---|---|
| KR | 1020080046891 A | 5/2008 |
| KR | 10-0941834 B1 | 2/2010 |
| KR | 1020110067250 A | 6/2011 |

* cited by examiner

*Primary Examiner* — Bradley K Smith
(74) *Attorney, Agent, or Firm* — Cantor Colburn LLP

(57) ABSTRACT

A method of manufacturing a display panel assembly includes: preparing a mother substrate on which are defined first regions and dummy regions respectively between adjacent first regions; forming pixel driving lines and pixels connected to the pixel driving lines on each of the first regions in a same process at the same time as forming circuit connection lines on each of the dummy regions; connecting a driving element which drives the pixels to the circuit connection lines of the dummy regions; dividing the mother substrate to separate the first regions and the dummy regions from each other, each of the separated first regions defining a thin film transistor board of the display panel assembly, and each of the separated dummy regions defining a driving circuit board of the display panel assembly; and connecting the driving circuit board to the thin film transistor board.

17 Claims, 9 Drawing Sheets

METHOD OF MANUFACTURING COMPONENTS OF DISPLAY PANEL ASSEMBLY FROM SAME MOTHER SUBSTRATE

This application claims priority to Korean Patent Application No. 10-2015-0004128, filed on Jan. 12, 2015, and all the benefits accruing therefrom under 35 U.S.C. §119, the entire contents of which are hereby incorporated by reference.

BACKGROUND (1) Field

The invention disclosed herein relates to a method of manufacturing a display panel assembly, and more particularly, to a method of manufacturing a display panel assembly inside which is mounted a relatively highly-integrated circuit board.

(2) Description of the Related Art

With the miniaturization and relatively high integration of elements mounted inside a display panel assembly, various electronic chips that are portions of the elements and a circuit board mounted with the various electronic chips have become smaller and thinner in dimension.

Electronic products from which an amount of data output and for which an output speed thereof is increased need a relatively high interconnection density. In order to meet the high interconnection density, elongated connection lines disposed on the electronic chips and the circuit board mounted with the electronic chips are disposed to have a line width narrower than a conventional line width of about 100 micrometers (μm).

SUMMARY

The disclosure provides a method of manufacturing a display panel assembly mounted with a relatively highly integrated circuit board.

One or more exemplary embodiment of the invention provides methods of manufacturing a display panel assembly, the methods including: preparing a mother substrate on which are defined a plurality of first regions and a plurality of dummy regions which is respectively between adjacent first regions; forming a plurality of pixel driving lines and a plurality of pixels which is connected to the pixel driving lines on each of the first regions of the mother substrate in a same process at the same time as forming a plurality of circuit connection lines on each of the dummy regions of the mother substrate; connecting a driving element which drives the plurality of pixels to the circuit connection lines of the dummy regions of the mother substrate; dividing the mother substrate including the pixel driving lines, the pixels and the circuit connection lines formed thereon to separate the first regions with the pixel driving lines and the pixels thereon and the dummy regions with the circuit connection lines thereon from each other, each of the separated first regions with the pixel driving lines and the pixels thereon defining a thin film transistor board of the display panel assembly, and each of the separated dummy regions with the circuit connection lines thereon defining a driving circuit board of the display panel assembly; and connecting the driving circuit board with the circuit connection lines thereon to the thin film transistor board with the pixel driving lines and the pixels thereon.

In some embodiments, each of the thin film transistor boards with the pixel driving lines and the pixels thereon may have a long side in a first direction, and has a short side in a second direction which intersects with the first direction.

In other embodiments, the dummy regions with the circuit connection lines thereon may include: a plurality of second regions disposed between first regions adjacent in the second direction; and a plurality of third regions disposed between first regions adjacent in the first direction.

In still other embodiments, the mother substrate may include further defined thereon: a plurality of first cutting lines extending in the first direction, the first cutting lines defined on the mother substrate at a boundary between first regions and second regions adjacent in the second direction; and a plurality of second cutting lines extending in the second direction, the second cutting lines defined on the mother substrate at a boundary between first regions and third regions adjacent in the first direction. The dividing of the mother substrate to separate first regions and the dummy regions from each other may include: cutting the mother substrate including the pixel driving lines, the pixels and the circuit connection lines formed thereon along the first cutting lines to separate the first regions with the pixel driving lines and the pixels thereon and the second regions with second region circuit connection lines thereon from each other; and cutting the mother substrate including the pixel driving lines, the pixels and the circuit connection lines formed thereon along the second cutting lines to separate the first regions with the pixel driving lines and the pixels thereon and the third regions with third region circuit connection lines thereon from each other.

In even other embodiments, the forming of the plurality of the circuit connection lines on each of the dummy regions may include forming second region circuit connection lines on a second region among the plurality of second regions. The connecting of the driving element to the circuit connection lines may include connecting the driving element to the second region circuit connection lines of the second region among the plurality of second regions to form the driving circuit board as a first printed circuit board.

In yet other embodiments, the connecting of the driving circuit board to the thin film transistor board may include connecting the first printed circuit board to the thin film transistor board through a plurality of first flexible circuit boards on which first data driving chips are mounted.

In further embodiments, the first printed circuit board may be connected to the long side of the thin film transistor board through the first flexible circuit boards.

In still further embodiments, the driving element is connected to the first data driving chips through the second region circuit connection lines of the first printed circuit board, and a data driving unit including the first data driving chips is connected to the pixel driving lines of the thin film transistor board connected to the first printed circuit board.

In even further embodiments, the pixel driving lines on the thin film transistor board of which the long side thereof is connected to the first printed circuit board may include a plurality of data lines.

In yet further embodiments, the driving element may include a timing controller and a power generation unit.

In much further embodiments, the forming of the plurality of pixels which is connected to the pixel driving lines on each of the first regions may form an amorphous silicon type gate driving unit on each of the first regions at the same time.

In still much further embodiments, the forming of the plurality of circuit connection lines on each of the dummy regions may further include forming third region connection lines on a third region among the third regions to form a second printed circuit board.

In even much further embodiment, the connecting of the driving circuit board to the thin film transistor board substrate may further include connecting the second printed circuit board to the thin film transistor board through a plurality of second flexible circuit boards on which second data driving chips are mounted.

In yet much further embodiments, the second printed circuit board may be connected to the short side of the thin film transistor board through the second flexible circuit boards.

In some embodiments, the pixel driving lines on the thin film transistor board of which the short side thereof is connected to the second printed circuit board further may include a plurality of gate lines. A gate driving unit including the second data driving chips may be connected to each of: the third region circuit connection lines of the second printed circuit board, the second region circuit connection lines of the first printed circuit board, and the pixel driving lines of the thin film transistor board connected to the second printed circuit board.

In other embodiments, the forming of the pixel driving lines, the pixels and the circuit connection lines may include a photolithography process.

In still other embodiments, the methods may further include: disposing a color filter board so as to be opposed to the thin film transistor board with the pixel driving lines and the pixels thereon; and disposing a liquid crystal layer between the thin film transistor board with the pixel driving lines and the pixels thereon and the color filter board.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
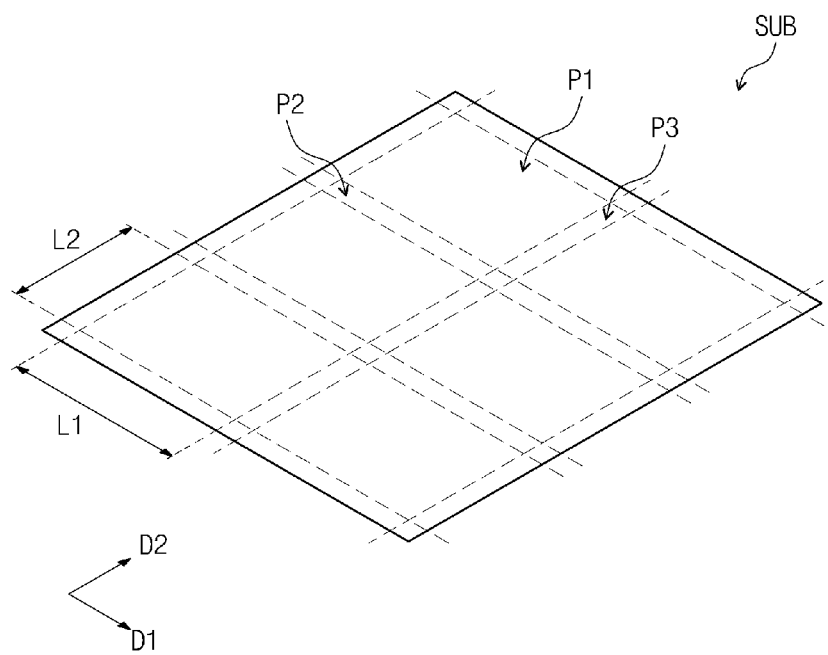
FIG. 1 is a perspective view illustrating an exemplary embodiment of a mother substrate according to the invention.

Advantages and features of the invention, and implementation methods thereof will be clarified through following exemplary embodiments described with reference to the accompanying drawings. The invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

Further, the invention is only defined by scopes of claims. In the drawings, like reference numerals refer to like elements throughout.

It will be understood that when element or layer (or film) is referred to as being "on/over" another element or layer, it can be directly on another element or layer, or intervening elements or layers may also be present. In contrast, when an element is referred to as being "directly on" or "directly over" another element, there are no intervening elements present. The term "and/or" includes any and all combinations of one or more of the associated listed items.

Spatially relative terms, "below," "beneath," "lower," "above," "upper" and the like may be used to indicate the relationship between one device or constituent elements and other devices or constituent elements, as shown in the drawings. It should be understood that the spatially relative terms include the direction illustrated in the drawings as well as other directions of devices during use or operation.

Though terms like a first and a second are used to describe various elements, components, and/or sections in various embodiments, the elements, components, and/or sections should not be limited by these terms. These terms are only used to distinguish one element, component, or section from another. These terms are used only to discriminate one element, component or section from another element, component or section. Therefore, a first element, a first component or a first section discussed below could be termed a second element, a second component or a second section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Additionally, the exemplary embodiments in the detailed description will be described with schematic sectional views and/or plain views as ideal exemplary views of the invention. Accordingly, shapes of the exemplary views may be modified according to manufacturing techniques and/or allowable errors Therefore, the exemplary embodiments of the invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the invention.

Hereinafter, exemplary embodiments of the invention will be described in more detail with reference to accompanying drawings.

A conventional method of forming a connection line includes an existing thick film process in which a relatively thick film is formed on a substrate such as a printed circuit board ("PCB"), through an inkjet printing method. Generally, to allow the connection lines disposed on the electronic chips and the circuit board mounted with the electronic chips to have a minimum line width, a thin film process may be used in which a relatively thin film is formed on a substrate through a photolithography method.

FIG. 1 is a perspective view illustrating an exemplary embodiment of a mother substrate according to the invention.

Referring to FIG. 1, a mother substrate SUB includes a plurality of first regions P1, a plurality of second regions P2 and a plurality of third regions P3. A material of the mother substrate SUB may include glass. Among regions of the mother substrate SUB, the first regions P1 exclude the second and third regions P2 and P3, and exclude any remaining regions not including the first to third regions P1 to P3 of the mother substrate SUB.

The first regions P1 may be disposed in a matrix configuration on the mother substrate SUB. Each of the first regions P1 has a rectilinear shape in a top plan view. Specifically, each of the first regions P1 has a first length L1 extended in a first direction D1 and a second length L2 extended in a second direction D2. The second direction D2 intersects with the first direction D1. The first length L1 may be longer than the second length L2.

The second regions P2 may be disposed between first regions P1 adjacent to each other in the second direction D2. Each of the second regions P2 has rectangular shape in the top plan view. Specifically, each of the second regions P2 has a long side extended in the first direction D1 and a short side extended in the second direction D2. Respective lengths of the second regions P2 in the first direction D1 are the first length L1 in the first direction D1.

The third regions P3 may be disposed between first regions P1 adjacent to each other in the first direction D1. Each of the third regions P3 has a rectangular shape. Specifically, each of the third regions P3 has a short side extended in the first direction D1 and a long side extended in the second direction D2. Respective lengths of the third regions P3 in the second direction are the second length L2 in the second direction D2.

A plurality of metal lines and a plurality of pixels which is connected to the metal lines may be disposed on the first region P1 of the mother substrate SUB. The metal lines disposed on the first region P1 may be signal lines or driving lines for an electronic product such as a display device, but are not limited thereto.

In an exemplary embodiment of manufacturing metal lines, the metal lines and pixels which are disposed on the first region P1 may be formed through a photolithography process.

Metal lines may be further disposed on the second region P2 of the mother substrate SUB. In an exemplary embodiment of manufacturing metal lines, the metal lines disposed on the second region P2 may be formed at the same time as the metal lines and the pixels which are formed on the first region P1, such as by the same photolithography process. The metal lines formed on the second region P2 may be connection lines CL.

An exemplary embodiment of a photolithography process will be described in more detail with reference to FIGS. 3A to 3G below.

Figure 2:
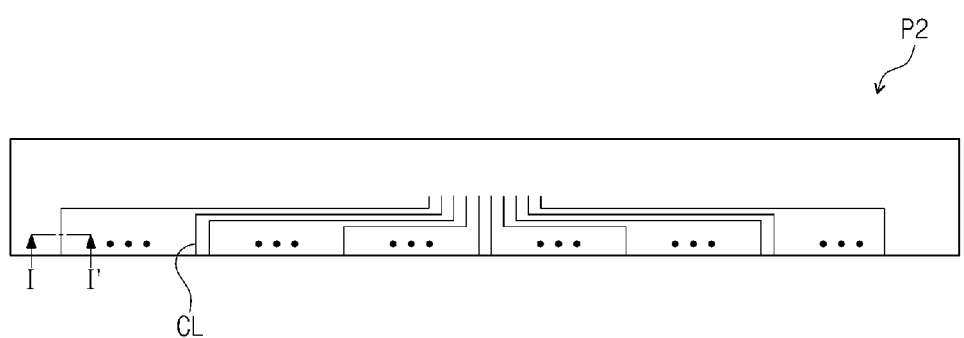
FIG. 2 is an enlarged view illustrating an exemplary embodiment of a second region of the mother substrate illustrated in FIG. 1.

FIG. 2 is an enlarged view illustrating an exemplary embodiment of a second region of the mother substrate illustrated in FIG. 1. Specifically, FIG. 2 is an exemplary view illustrating connection lines CL disposed on the second region P2 of the mother substrate SUB illustrated in FIG. 1.

Referring to FIG. 2, the plurality of connection lines CL may be disposed within the second region P2. The connection lines CL each extend downward from a central portion of the second region P2. Specifically, starting from a first end of the connection lines CL at the central portion of the second region P2, the connection lines CL may extend downward in the second direction D2 from the central portion of the second region P2, continuously further extend in the first direction D1, and then continuously extend downward in the second direction D2. The invention is not limited thereto, but the connection lines CL may be designed in various shapes and be disposed within the second region P2. A second end of the connection lines CL may terminate adjacent to or aligned with an edge of the second region P3.

FIGS. 3A to 3G are cross-sectional views illustrating an exemplary embodiment of a method of forming a metal connection on a mother substrate taken along line I-I' of FIG. 2.

Figure 3A:
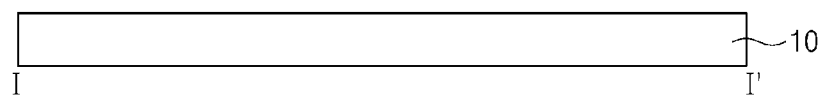
FIGS. 3A to 3G are cross-sectional views illustrating an exemplary embodiment of a method of forming a metal line on a mother substrate taken along line I-I' of FIG. 2.
Figure 3B:
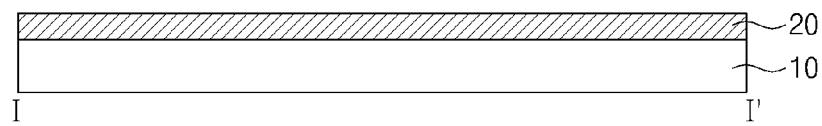

Referring to FIGS. 3A and 3B, a substrate 10 is prepared. The substrate 10 may be the mother substrate SUB. In the exemplary embodiment, the substrate 10 includes glass, but the invention is not limited thereto.

A metal layer 20 is applied on the glass substrate 10. The metal layer 20 includes a metal material. In an exemplary embodiment, for example, the metal layer 20 may include aluminum (Al), tungsten (W), copper (Cu), argon fluoride (ArF), or the like.

Figure 3C:
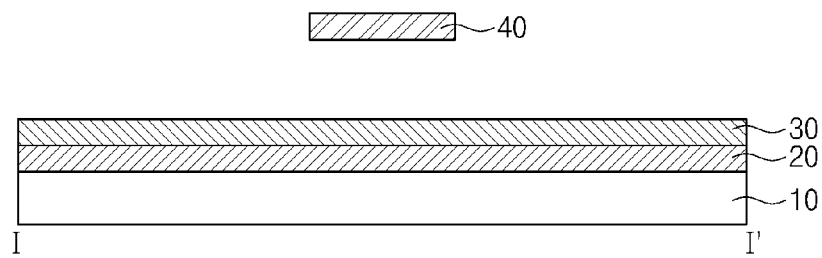
Figure 3D:
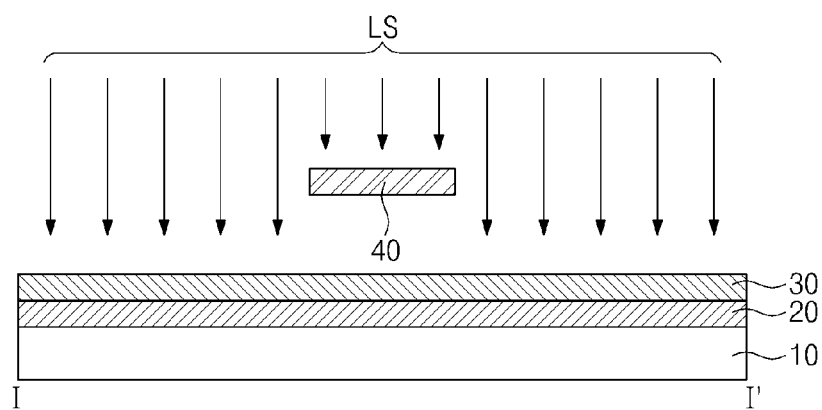

Referring to FIGS. 3C and 3D, a photoresist layer 30 is applied on the metal layer 20. The photoresist layer 30 may be applied on the metal layer 20 through a spin coating method.

The photoresist layer 30 includes a positive photoresist material or a negative photoresist material. In the illustrated exemplary embodiment, the photoresist layer 30 as including a positive photoresist material was applied on the metal layer 20.

A mask 40 is disposed on the applied photoresist layer 30. A shape and dimensions of the mask 40 corresponds to a predetermined pattern. The predetermined pattern may have the substantially the same shape as a circuit wiring to be disposed on the mother substrate SUB.

The photoresist layer 30 on which the mask 40 is disposed is subject to an exposure process. Light LS is used in the exposure process. In an exemplary embodiment, the light LS may be a laser beam, but the invention is not limited thereto. The light LS is irradiated on the photoresist layer 30 with the mask 40 disposed thereon. Since the mask 40 blocks the light LS, the light LS is not irradiated on the region of the photoresist layer 30 which overlaps the mask 40, and the light LS is irradiated on the region of the photoresist layer 30 which does not overlap the mask 40. The region of the photoresist layer 30 to which the light LS is not irradiated is a non-exposed region of the photoresist layer 30, and the region of the photoresist layer 30 to which the light LS is irradiated is an exposed region of the photoresist layer 30.

Figure 3E:
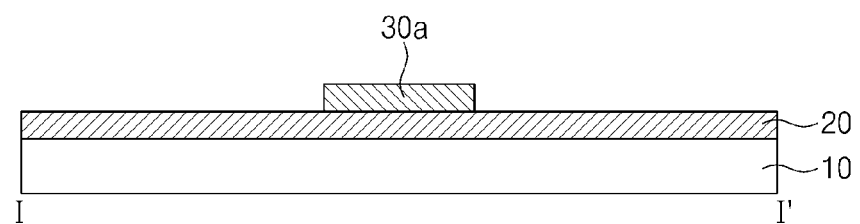

Referring to FIG. 3E, the exposed region of the photoresist layer 30 is removed via a development process, and the non-exposed region 30a of the photoresist layer 30 is not removed. The non-exposed region 30a of the photoresist layer 30 remains disposed on the metal layer 20. The non-exposed region 30a of the photoresist layer 30 remaining on the metal layer 20 exposes portions of the underlying metal layer 20.

Figure 3F:
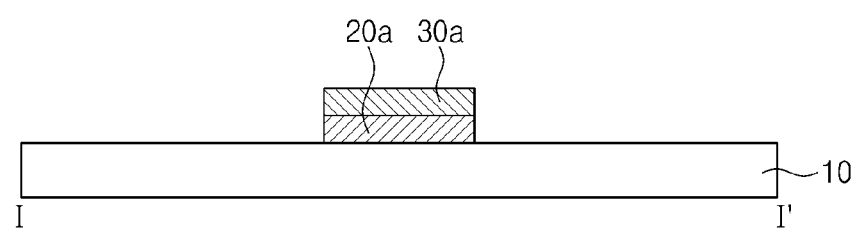

Referring to FIG. 3F, with the remaining region 30a of the photoresist layer 30 disposed on the metal layer 20, the metal layer 20 is etched by using the remaining region 30a of the photoresist layer 30 as a mask. Specifically, the exposed portions of the metal layer 20 that do not overlap the remaining region 30a of the photoresist layer are removed through an etching process. A non-etched portion 20a of the metal layer 20 remains disposed on the glass substrate 10. The non-etched portion 20a of the metal layer 20 remaining on the glass substrate 10 exposes regions of the underlying glass substrate 10.

Figure 3G:
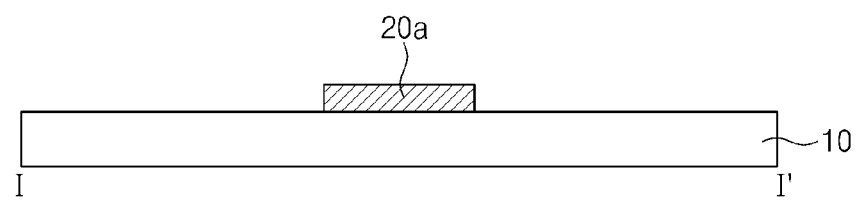

Referring to FIG. 3G, the remaining portion 30a of the photoresist layer 30 illustrated in FIG. 3F is removed, and the remaining portion 20a of the metal layer 20 remains to be disposed on the glass substrate 10. Referring back to FIGS. 1 and 2, the glass substrate 10 illustrated in FIGS. 3A-3G may be the second region P2 of the mother substrate SUB, and the remaining portion 20a of the metal layer 20 may be the connection wiring CL, but the invention is not limited thereto.

Although not shown, a plurality of remaining portions 20a of the metal layer 20 may be vertically stacked on the glass substrate 10. Insulation layers (not shown) may be disposed between adjacent remaining portions 20a of the metal layer 20a in the vertical (e.g., cross-sectional or thickness) direction. The insulation layers function to separate adjacent remaining portions 20a of the metal layer 20 from each other so as to be spaced apart from each other in the vertical direction. In an exemplary embodiment of a method of forming a metal connection on a mother substrate, the insulation layers may be formed through a sputtering process or a spin coating process to apply an insulation material at a predetermined thickness on the glass substrate 10.

Therefore, referring again to FIGS. 1 and 2, through the processes illustrated in FIGS. 3A to 3G, the metal layers 20a and insulation layers therebetween formed on the mother substrate SUB may be used as a metal connection for elements of an electronic device, such as connection lines, pixels, driving lines, electrodes, etc. of the electronic device.

FIG. 4A to 4E are views sequentially illustrating an exemplary embodiment of a method of manufacturing display panel assembly according to the invention.

Figure 4A:
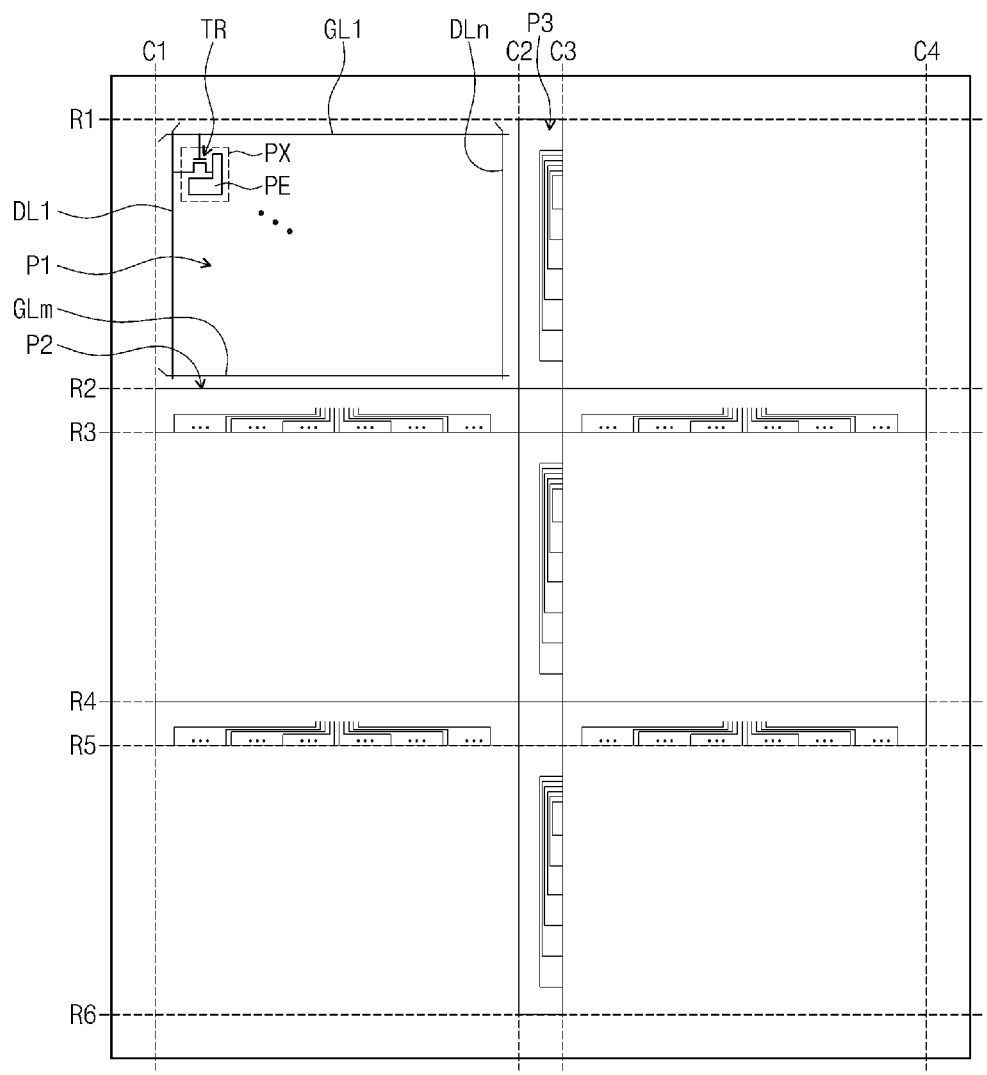
FIGS. 4A to 4E are views sequentially illustrating an exemplary embodiment of a method of manufacturing display panel assembly according to the invention.

FIG. 4A is a top plan view illustrating a mother substrate on which a metal line of the display panel assembly is formed.

Referring to FIG. 4A, the display panel assembly includes a plurality of metal connections. In the illustrated exemplary embodiment, the metal connections of the display panel assembly include a plurality of pixels PX and a plurality of driving lines DL1 to DLn and GL1 to GLm disposed within the first region P1 of the mother substrate SUB. The driving lines DL1 to DLn and GL1 to GLm include data lines DL1 to DLn and gate lines GL1 to GLm. The data lines DL1 to DLn have lengths extended in the second direction D2, and the gate lines GL1 to GLn have lengths extended in the first direction D1. Respective widths of the driving lines DL1 to DLn and GL1 to GLm are defined in a direction perpendicular to the lengths thereof.

The pixels PX are connected to the data lines DL1 to DLn and the gate lines GL1 to GLm. Each of the pixels PX includes a thin film transistor TR that is connected to a corresponding data line among the data lines DL1 to DLn and to a corresponding gate line among the gate lines GL1 to GLm, and a pixel electrode PE connected to the thin film transistor TR.

The thin film transistor TR includes a source electrode (not shown) connected to the corresponding data line among the data lines DL1 to DLn, a gate electrode (not shown) connected to the corresponding data line among the gate lines GL1 to GLm, and a drain electrode (not shown) connected to the pixel electrode PE.

The source and drain electrodes of the thin film transistor TR are disposed in a same layer as such as by being formed in the same process as that of the data lines DL1 to DLn. The gate electrode of the thin film transistor TR is disposed in a same layer as such as by being formed in the same process as that of the gate lines GL1 to GLm.

In an exemplary embodiment of a method of forming a metal connection on a mother substrate SUB, the data lines DL1 to DLn, the gate lines GL1 to GLm, and the gate, source and drain electrodes may be formed through a photolithography process. Therefore, in forming the pixels PX, the driving lines DL1 to DLn and GL1 to GLm may be formed at the same time with the pixels PX. That is, the pixels PX and the driving lines DL1 to DLn and GL1 to GLm formed within the first region P1 of the mother substrate SUB, and the connection lines CL formed on the second region P2 of the same mother substrate SUB for which the pixels PX and the driving lines DL1 to DLn and GL1 to GLm are formed, may be formed in the same process at the same time.

Among the plurality of the metal connections of the display panel assembly, the connection lines CL, which connect the driving lines DL1 to DLn and GL1 to GLm in the first region P1 with driving elements (not shown), are formed within the second region P2 of the mother substrate SUB.

Figure 4B:
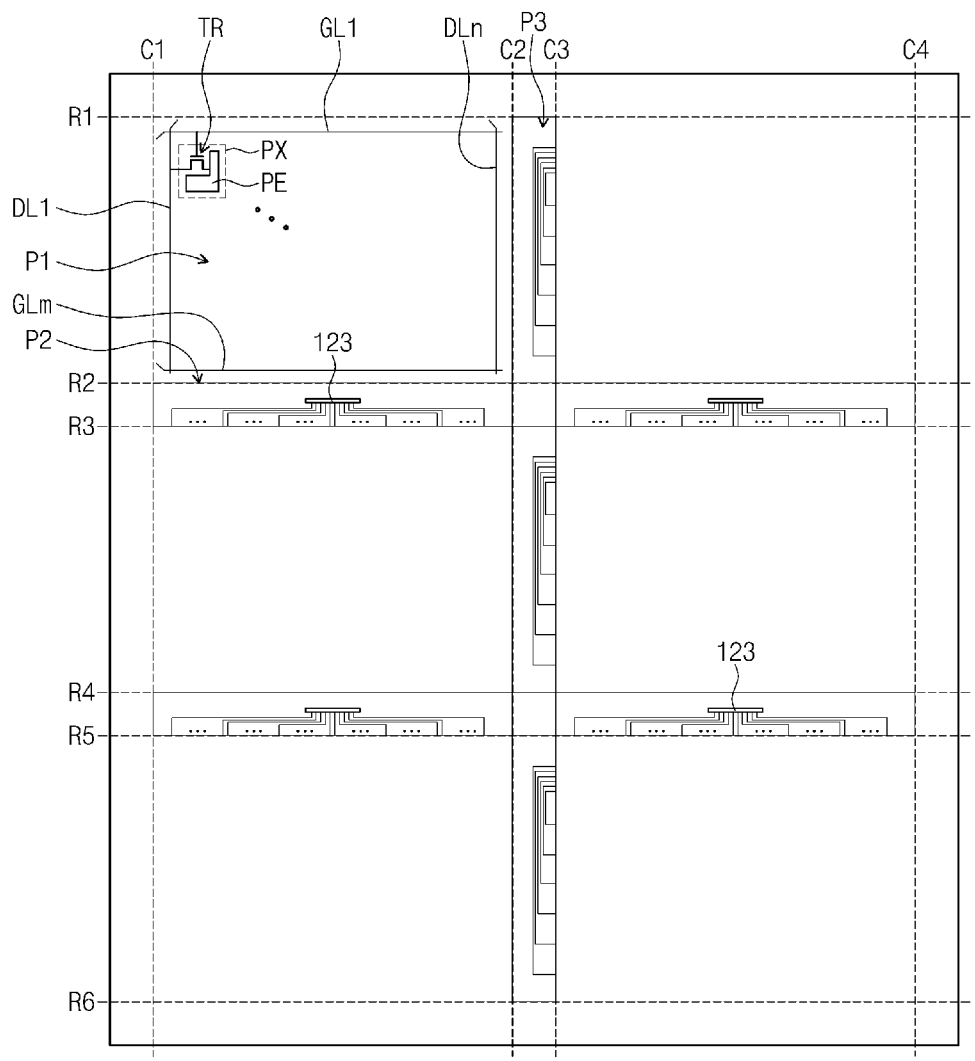

FIG. 4B is a top plan view illustrating the mother substrate of FIG. 4A on which driving elements are further disposed.

Referring to FIG. 4, after the connection lines CL are formed, driving elements are disposed on the second region P2. The driving elements include, for example, a timing controller 123. Among driving elements of the display panel assembly, only the timing controller 123 is illustrated in the drawings for convenience, but the invention is not limited thereto. In an exemplary embodiment, the driving elements of the display panel assembly may also include a power generation unit (not shown) disposed on the second region P2.

Additionally, as illustrated in FIGS. 4A and 4B, the connection lines CL may be disposed within the third region P3, with or without driving elements disposed in the third region P3. After the connection lines CL are formed within the third region P3, driving elements may be disposed within the third region P3. In an exemplary embodiment, for example, the driving elements of the display panel assembly may further include a gate voltage unit (not shown) disposed in the third region P3.

The connection lines CL disposed within the second region P2 may be connected to the data lines DL1 to DLn disposed within the first region P1, and the connection lines CL disposed within the third region P3 may be connected to the gate lines GL1 to GLm disposed within the first region P1. Exemplary embodiments of the foregoing configurations will be described below in more detail with reference to FIGS. 5A and 5B.

For an overall mother substrate SUB on which metal connections are formed, a plurality of first cutting lines R1 to R6 and a plurality of second cutting lines C1 to C4 are defined. The first cutting lines R1 to R6 have lengths extended in the first direction D1 and are arranged in the second direction D2. The second cutting lines C1 to C4 have lengths extended in the second direction D2 and are arranged in the first direction D1. The first cutting lines R1 to R6 are defined on the mother substrate SUB at a boundary between first regions P1 and second regions P2 adjacent in the second direction D2. The second cutting lines C1 to C4 are defined on the mother substrate SUB at a boundary between first regions P1 and third regions P3 adjacent in the first direction D1.

The mother substrate SUB may be divided into individual portions of the first region P1, the second region P2 and the third region P3 separate from each other with respect to the first cutting lines R1 to R6 and the second cutting lines C1 to C4. In an exemplary embodiment of manufacturing a display panel assembly, for example, the mother substrate SUB may be cut along the first cutting lines R1 to R6 and the second cutting lines C1 to C4 to form individual display panel assembly portions. A method of cutting the mother substrate SUB includes, but is not limited to, a laser processing method, a dicing method, a scribing method, and the like.

Figure 4C:
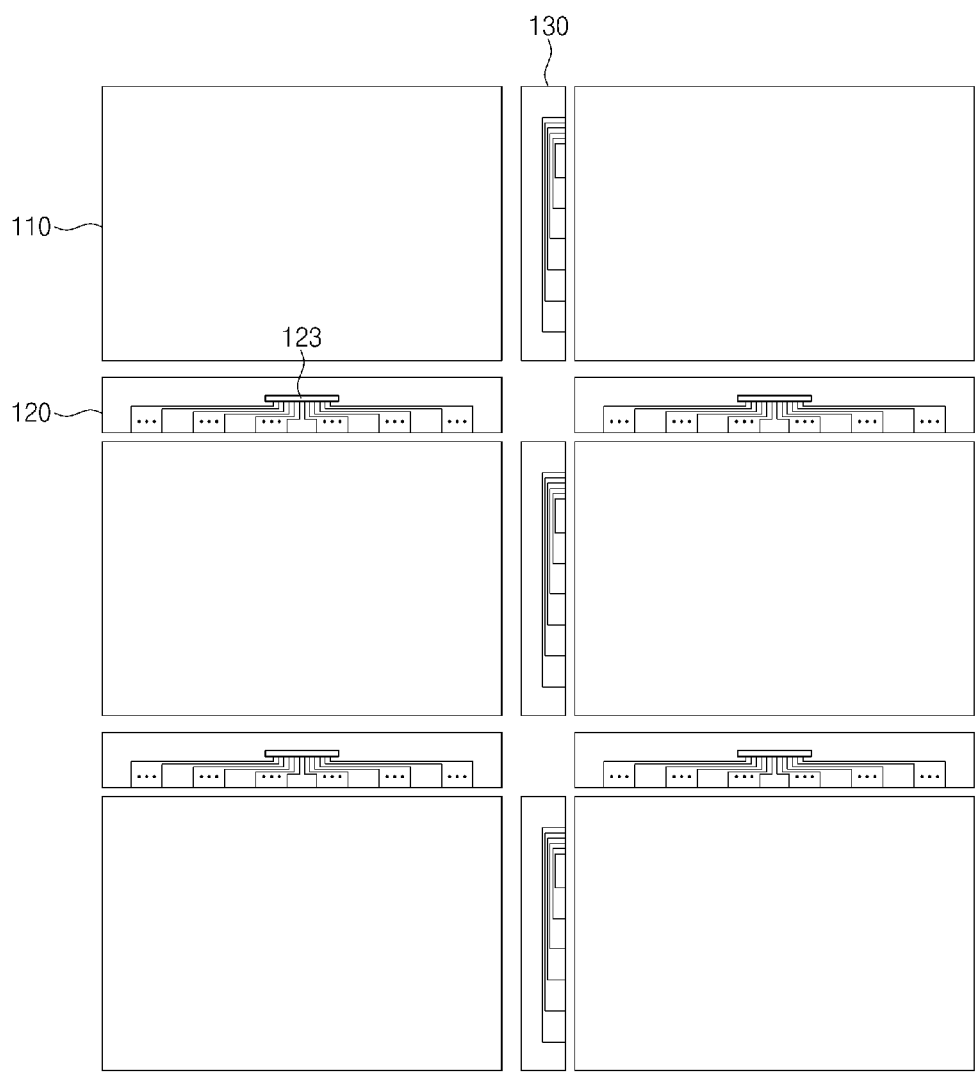

FIG. 4C is a top plan view illustrating separated individual portions of a mother substrate after the mother substrate has been cut.

Referring to FIGS. 4A to 4C, the separated individual first region P1 of the mother substrate SUB may be a thin film transistor ("TFT") display panel or TFT board 110 of an electronic device such as a display panel assembly. The separated individual second region P2 of the mother substrate SUB may be a data circuit board 120 of the display panel assembly. The separated individual third region P3 of the mother substrate SUB may be a gate circuit board 130 of the display panel assembly.

Figure 4D:
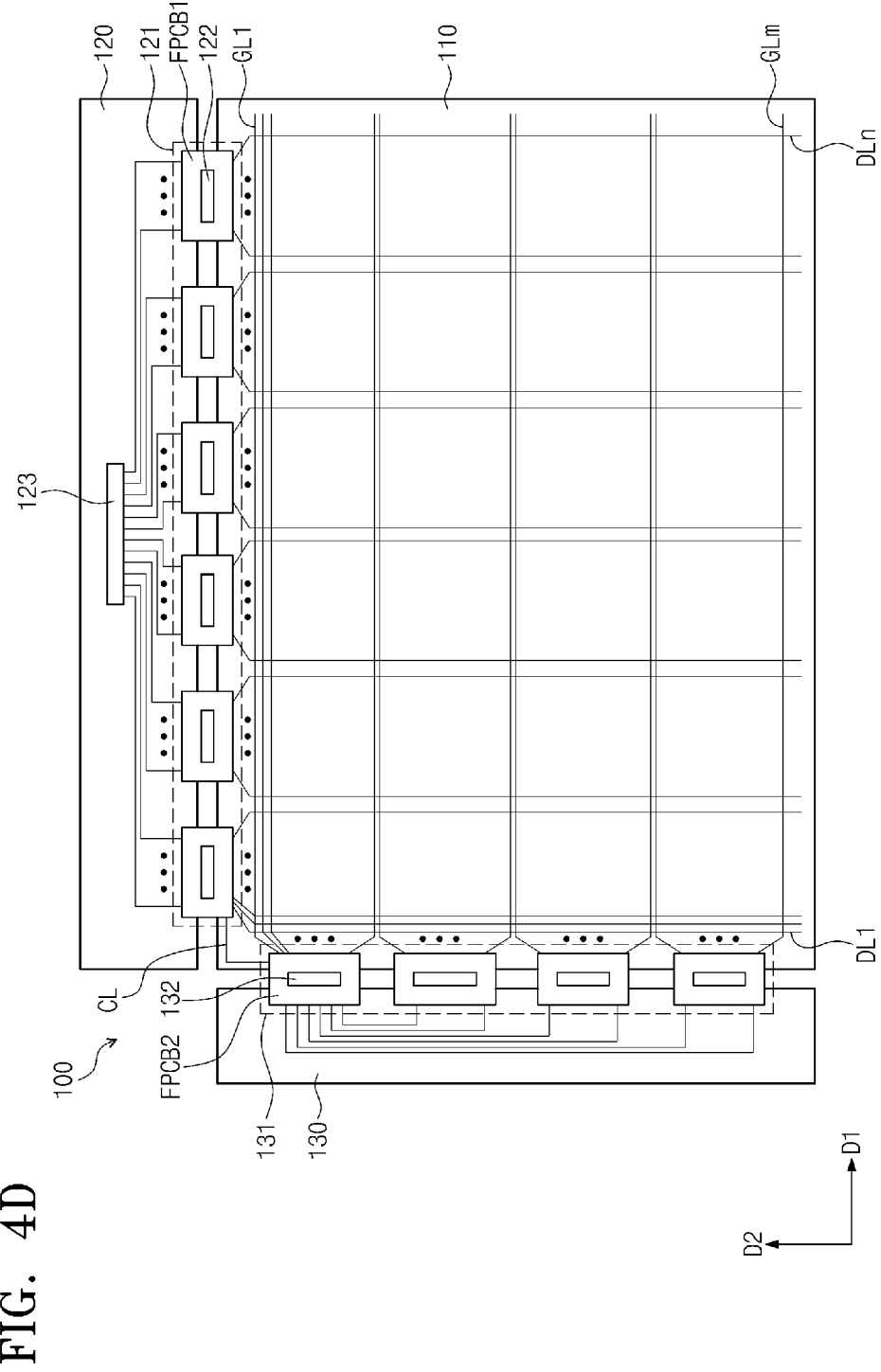

FIG. 4D is a view illustrating an individual TFT board illustrated in FIG. 4C connected to individual ones of a data circuit board and a gate circuit board illustrated in FIG. 4C, among components of a display panel assembly 100.

Referring to FIGS. 4A to 4D, the individual TFT board 110 with metal connections formed thereon is connected to each of the individual ones of the data circuit board 120 and the gate circuit board 130 each with metal connections formed thereon. Specifically, a first side of the TFT board 110 is connected to the data circuit board 120 disposed adjacent in the second direction D2, and a second side of the TFT board 110 is connected to the gate circuit board 130 in the first direction D1.

The TFT board 110 is connected to each of the data circuit board 120 and the gate circuit board 130 by first and second flexible circuit boards FPCB1 and FPCB2, respectively. Specifically, the first side of the TFT board 110 is connected to the data circuit board 120 adjacent in the second direction D2 through a plurality of first flexible circuit boards FPCB1, and the second side of the TFT board 110 is connected to the gate circuit board 130 adjacent in the first direction D1 through a plurality of second flexible circuit boards FPCB2. The first flexible circuit boards FPCB1 and the second flexible circuit boards FPCB2 have flexibility.

The display panel assembly 100 further includes a data driving unit 121 and a gate driving unit 131. The data driving unit 121 includes a plurality of data driving chips 122, and the gate driving unit 131 includes a plurality of gate driving chips 132. The data driving chips 122 and the gate driving chips 132 are respectively mounted on the corresponding first and second flexible circuit boards FPCB1 and FPCB2, and may be connected to the TFT board 110 through a tape carrier package ("TCP") type connection. The data driving unit 121 and the gate driving unit 131 may be referred to as including the first and second flexible circuit boards FPCB1 and FPCB2 and the data driving chips 122 and the gate driving chips 132 respectively mounted thereon.

A plurality of data lines DL1 to DLn and a plurality of gate lines GL1 to GLm are arranged so that lengths thereof extend in the second and first directions D2 and D1 on the TFT board 110, respectively. At this time, the "n" and "m" are integers greater than 0. Among the metal connections of the display panel assembly, the data lines DL1 to DLn and the gate lines GL1 to GLm may intersect with each other with the insulation layer disposed therebetween. Distal ends of the data lines DL1 to DLn may be connected to the data driving unit 121 to receive analogue data voltages therefrom.

The gate lines GL1 to GLm may be connected to the gate driving unit 131 to receive sequential gate signals therefrom. In an exemplary embodiment, each of the thin film transistor TR and the pixel electrode PE is disposed at a region in which the data lines DL1 to DLn and the gate lines GL1 to GLm intersect with each other, but the invention is not limited thereto. The pixels PX are connected to the data lines DL1 to DLn and to the gate lines GL1 to GLm.

The data circuit board 120 includes a voltage generation unit (not shown) which generates various voltages that are supplied to the TFT board 110, metal lines transferring various signals based on the various voltages, and a timing controller 123 which outputs the various signals to supply the gate driving unit 131 and to supply the data driving unit 121 with the various signals. The timing controller 123 may be mounted on the data circuit board 120 in an integrated circuit chip form. The integrated circuit chip form timing controller 123 is connected to both the gate driving unit 131 and the data driving unit 121. The connection lines of the gate circuit board 130 (e.g., the third region P3 of the mother substrate SUB) may be connected to the gate driving unit 131 and the connection lines of the data circuit board 120 (e.g., the second region P2 of the mother substrate SUB). In an exemplary embodiment, a connection line on the TFT board 110 may be extended from the gate driving circuit 131 to a first flexible circuit board FPCB1, where such first flexible circuit board FPCB1 is connected to the timing controller 123 via a connection line of the data circuit board 120.

The data driving unit 121 connected to the data circuit board 120 receives image signals and a data control signal from the timing controller 123 of the data circuit board 120. The data driving unit 121 responds to the received data control signal to generate analogue data voltages corresponding to the received image signals. The data driving unit 121 supplies the generated data voltages to pixels PX of the TFT board 110 through the data lines DL1 to DLn connected to the data driving unit 121.

The gate circuit board 130 includes connection lines CL through which is applied to the gate driving unit 131, a gate signal which turns on/off the thin film transistor TR disposed on the TFT board 110 and a control signal which controls application of the gate signal to the thin film transistor TR.

The gate driving unit 131 responds to the gate control signal supplied from the timing controller 123 mounted on the data circuit board 120 to generate gate signals. The generated gate signals are sequentially supplied to the pixels PX on the TFT board 110 through the gate lines GL1 to GLm in a row unit along a length of the gate lines GL1 to GLm. As a result, the pixels PX may be driven in a row unit.

Figure 4E:
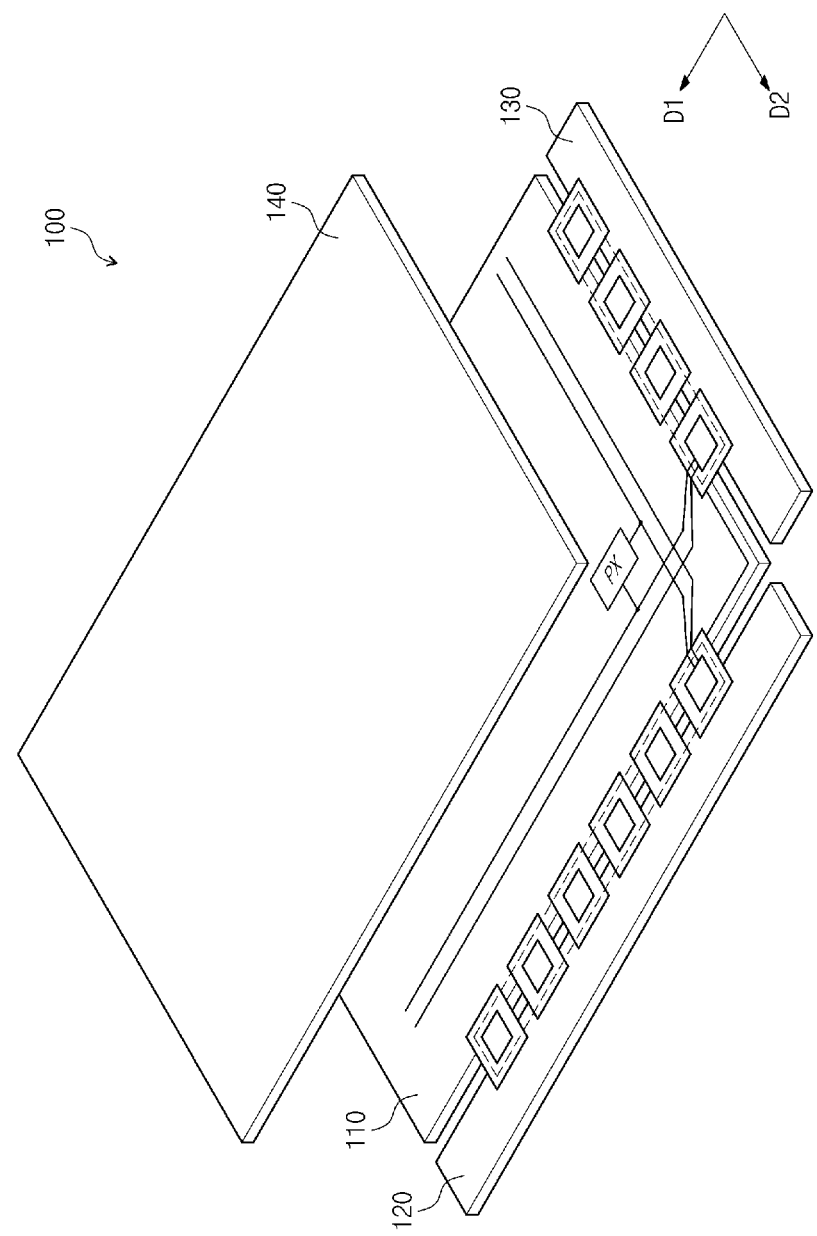

FIG. 4E is a perspective view illustrating an exemplary embodiment of components of a display panel assembly according to the invention.

The display panel assembly 100 as including the TFT board 110, the data circuit board 120 and the gate circuit board 130 may further include a color filter board 140.

The color filter display panel or display board 140 is disposed so as to be opposed to the TFT board 110. Although not shown, a light transmitting medium such as a liquid crystal layer is disposed between the TFT board 110 and the color filter board 140.

A red, green and blue ("RGB") color pixel expressing a predetermined color among red, green and blue may be disposed on the color filter board 140. The RGB color pixel may be disposed on the color filter board 140 so as to correspond to the pixels PX disposed on the TFT board 110. Also, a common electrode (not shown) may be disposed on an entire surface of the color filter board 140, but the invention is not limited thereto. The common electrode may include indium tin oxide.

The pixels PX respond to gate signals received through the gate lines GL1 to GLn to receive data voltages through the data lines DL1 to DLn. The pixels PX display color gradation corresponding to the data voltages.

Specifically, a common voltage is applied to the common electrode. The thin film transistor TR receives the gate signal through corresponding gate lines GL1 to GLm to be turned on thereby. The turned-on thin film transistor TR supplies the data voltage received through the data lines DL1 to DLn to the pixel electrode PE.

An electric field is formed between the pixel electrode PE and the common electrode due to the difference between the common voltage and the pixel voltage. Liquid crystal molecules of the liquid crystal layer are driven by the electric field formed between the pixel electrode PE and the common electrode. Light transmittance is adjusted by the driven liquid crystal molecules to display an image.

A portion of the TFT board 110 in which the light transmittance is adjusted by the driven liquid crystal molecules to actively display an image may be in a display area of the display panel assembly 100. A portion of the TFT board 110 at which light is not transmitted may be in a non-display area of the display panel assembly 100. The data circuit board 120 and the gate circuit board 130 as providing driving components, signal generators, etc. of the display panel assembly 100 may also be in the non-display area of the display panel assembly 100. The first region P1 of the mother substrate SUB from which the TFT board 110 is provided may be considered as an active region of the mother substrate SUB. The second and third regions P2 and P3 of the mother substrate SUB from which the data circuit board 120 and the gate circuit board 130 are provided may be considered as a non-active (e.g., dummy) region of the mother substrate SUB.

According to one or more exemplary embodiment of the invention, a single, continuous mother substrate SUB in an un-cut state (e.g., before a cutting process) includes a plurality of first regions P1, a plurality of second regions P2 disposed between adjacent first regions P1 in a second direction D2, and a plurality of third regions P3 disposed between adjacent first regions P1 in the first direction D1. For the first to third regions P1 to P3, elements such as metal connections for each of the first to third regions P1 to P3 are formed at a same time such as by a same process on the single, continuous mother substrate SUB.

In a conventional method of manufacturing an electronic device such as a display panel assembly, when the data circuit board 120 and the gate circuit board 130 are manufactured to include elements such as metal connections disposed thereon by forming such elements on separate substrates of the data circuit board 120 and the gate circuit board 130, since additional substrates are used, costs are undesirably increased. Also, in the conventional method of manufacturing the elements of the electronic device, the data circuit board 120 and the gate circuit board 130 are manufactured by using additional processes on the separate substrates. Therefore, manufacturing process time is undesirably increased.

However, according to one or more exemplary embodiment of the invention, since separate substrates are not used in forming elements such as metal connections of an electronic device on a base substrate, components of the electronic device such as the TFT board 110, the data circuit board 120 and the gate circuit board 130 may be manufactured on the same single, continuous mother substrate SUB through the same process at the same time. Accordingly, in manufacturing the electronic device such as the display panel assembly 100, costs may be advantageously decreased and the process time may be advantageously decreased.

Also, according to one or more exemplary embodiment of the invention, elements such as metal connections of the data circuit board 120 and the gate circuit board 130 of the display panel assembly 100 may be manufactured in the same photography process as that used to form the elements of the TFT board 110 of the display panel assembly 100. In the data circuit board 120 and the gate circuit board 130 manufactured through the photolithography process, a highly integrated design for metal connection such as a metal line is possible compared to a conventional data circuit board and gate circuit board manufactured through an inkjet process.

Figure 5:
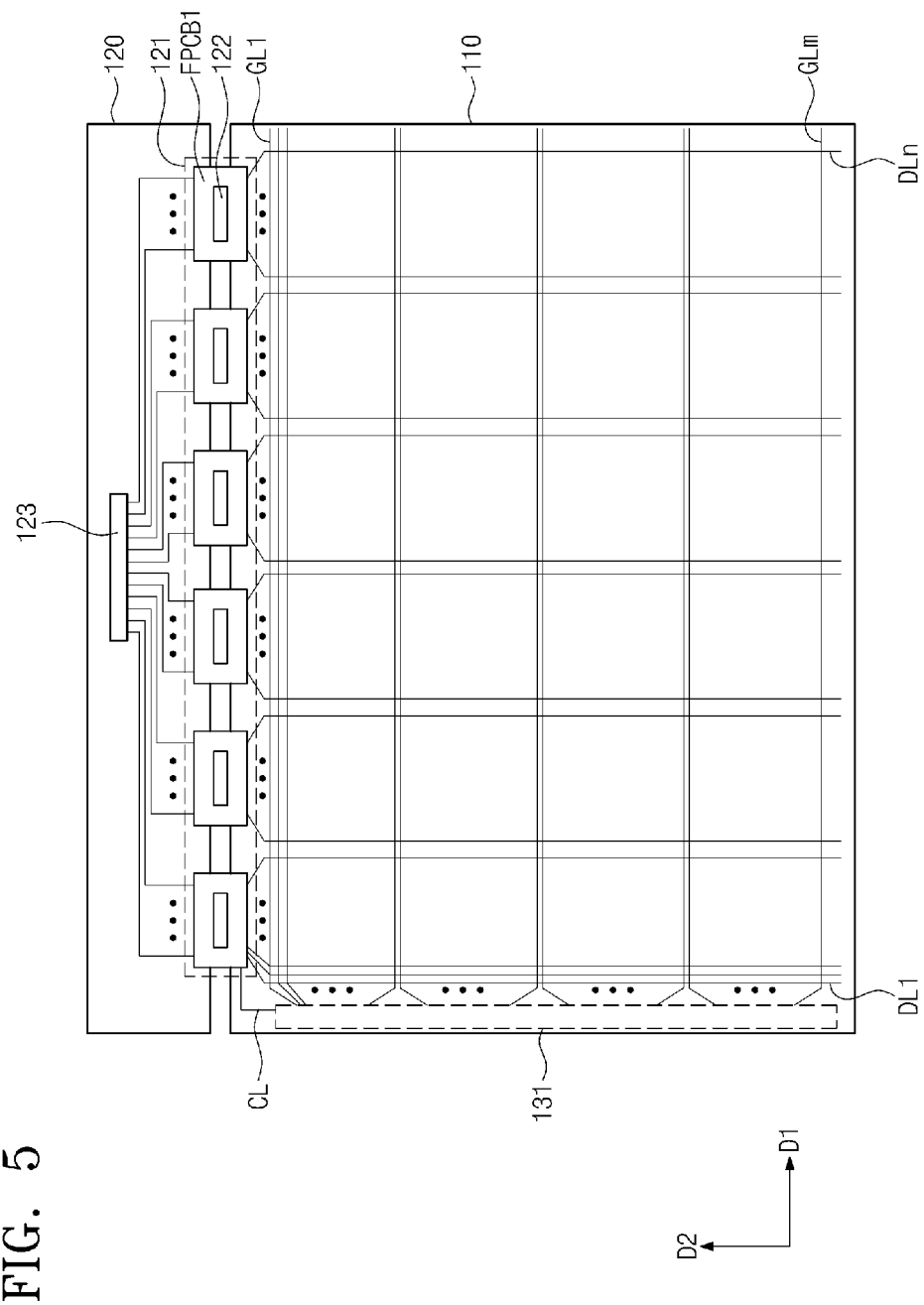
FIG. 5 is a perspective view illustrating another exemplary embodiment of a display panel assembly according to the invention.

FIG. 5 is a plan view illustrating another exemplary embodiment of a display panel assembly according to the invention.

Referring to FIG. 5, a display panel assembly 100 according to another exemplary embodiment of the invention includes a TFT board 110, a data circuit board 120, a data driving unit 121 and a gate driving unit 131.

The invention is not limited to the gate driving unit 131 includes the second flexible circuit boards FPCB2 as illustrated in FIGS. 4D and 4E, but the gate driving unit 131 may be disposed on the base substrate of the TFT board 110 so as to be formed at the same time such as by a same process with the thin film transistors TR of the pixels PX of the TFT board 110. The gate driving unit 131 disposed on the base substrate of the TFT board 110 may be mounted on the TFT board 110 in an amorphous silicon TFT gate ("ASG") driver circuit configuration. Where the gate driving unit 131 disposed on the base substrate of the TFT board 110, a separate gate circuit board 130 may be omitted. That is, in an exemplary embodiment of manufacturing a display panel assembly, the process of providing the gate circuit board 130 and elements thereof on the third region P3 of a mother substrate SUB may be omitted. The gate driving unit 131 and the connection lines of the data circuit board 120 (e.g., the second region P2 of the mother substrate SUB) may be connected to each other. In an exemplary embodiment, a connection line on the TFT board 110 may be extended from the gate driving circuit 131 to a first flexible circuit board FPCB1, where such first flexible circuit board FPCB1 is connected to the timing controller 123 via a connection line of the data circuit board 120.

In an exemplary embodiment of manufacturing a display panel assembly for which the process of providing the gate circuit board 130 and elements thereof on the third region P3 of a mother substrate SUB is omitted, manufacturing costs of the display panel assembly 100 may be advantageously further reduced, and process time is advantageously reduced at the same time, thereby manufacturing the highly integrated display panel assembly 100.

In one or more exemplary embodiment of the invention described above, a display panel assembly according to the invention may include a highly integrated circuit board for which a plurality of elements thereof (e.g., metal connections, etc.) are formed on a base substrate.

While the invention has been particularly shown and described with reference to exemplary embodiments thereof, it will be understood by those of ordinary skill in the art that various changes in form and details may be made therein without departing from the spirit and scope of the invention. Further, it should be construed that exemplary embodiments disclosed here are examples and not restrictive. It is intended that the scope of the invention is defined by claims, not by the description above, and encompasses all modifications and variations equivalent in meaning and scope to the claims.

What is claimed is:

1. A method of manufacturing a display panel assembly, the method comprising:
    preparing a mother substrate on which are defined a plurality of first regions and a plurality of dummy regions which is respectively between adjacent first regions;
    forming a plurality of pixel driving lines and a plurality of pixels which is connected to the pixel driving lines on each of the first regions of the mother substrate in a same process at the same time as forming a plurality of circuit connection lines on each of the dummy regions of the mother substrate;
    connecting a driving element which drives the plurality of pixels to the circuit connection lines of the dummy regions of the mother substrate;
    dividing the mother substrate including the pixel driving lines, the pixels and the circuit connection lines formed thereon to separate the first regions with the pixel driving lines and the pixels thereon and the dummy regions with the circuit connection lines thereon from each other,
    each of the separated first regions with the pixel driving lines and the pixels thereon defining a thin film transistor board of the display panel assembly, and each of the separated dummy regions with the circuit connection lines thereon defining a driving circuit board of the display panel assembly; and
    connecting the driving circuit board with the circuit connection lines thereon to the thin film transistor board with the pixel driving lines and the pixels thereon.

2. The method of claim 1, wherein each of the thin film transistor boards with the pixel driving lines and the pixels thereon has a long side in a first direction, and has a short side in a second direction which intersects with the first direction.

3. The method of claim 2, wherein the dummy regions with the circuit connection lines thereon comprise:
    a plurality of second regions disposed between first regions adjacent in the second direction; and
    a plurality of third regions disposed between first regions adjacent in the first direction.

4. The method of claim 3, wherein
    the mother substrate comprises further defined thereon:
        a plurality of first cutting lines extending in the first direction, the first cutting lines defined on the mother substrate at a boundary between first regions and second regions adjacent in the second direction; and
        a plurality of second cutting lines extending in the second direction, the second cutting lines defined on the mother substrate at a boundary between first regions and third regions adjacent in the first direction, and
    the dividing of the mother substrate to separate the first regions and the dummy regions from each other comprises:
        cutting the mother substrate including the pixel driving lines, the pixels and the circuit connection lines formed thereon along the first cutting lines to separate the first regions with the pixel driving lines and the pixels thereon and the second regions with second region circuit connection lines thereon from each other; and
        cutting the mother substrate including the pixel driving lines, the pixels and the circuit connection lines formed thereon along the second cutting lines to separate the first regions with the pixel driving lines and the pixels thereon and the third regions with third region circuit connection lines thereon from each other.

5. The method of claim 3, wherein
    the forming of the plurality of the circuit connection lines on each of the dummy regions comprises forming second region circuit connection lines on a second region among the plurality of second regions, and
    the connecting of the driving element to the circuit connection lines comprises connecting the driving element to the second region circuit connection lines of the second region among the plurality of second regions to form the driving circuit board as a first printed circuit board.

6. The method of claim 5, wherein the connecting of the driving circuit board to the thin film transistor board comprises connecting the first printed circuit board to the thin film transistor board through a plurality of first flexible circuit boards on which first data driving chips are mounted.

7. The method of claim 6, wherein the first printed circuit board is connected to the long side of the thin film transistor board through the first flexible circuit boards.

8. The method of claim 7, wherein
    the driving element is connected to the first data driving chips mounted on the first flexible circuit boards through the second region circuit connection lines of the first printed circuit board, and
    a data driving unit comprising the first data driving chips is connected to the pixel driving lines of the thin film transistor board connected to the first printed circuit board.

9. The method of claim 8, wherein the pixel driving lines on the thin film transistor board of which the long side thereof is connected to the first printed circuit board comprise a plurality of data lines.

10. The method of claim 9, wherein the driving element comprises a timing controller and a power generation unit.

11. The method of claim 10, wherein the forming of the plurality of pixels which is connected to the pixel driving lines on each of the first regions forms an amorphous silicon type gate driving unit on each of the first regions at the same time.

12. The method of claim 10, wherein the forming of the plurality of circuit connection lines on each of the dummy regions further comprises forming third region circuit connection lines on a third region among the third regions to form a second printed circuit board.

13. The method of claim 12, wherein the connecting of the driving circuit board to the thin film transistor board substrate further comprises connecting the second printed circuit board to the thin film transistor board through a plurality of second flexible circuit boards on which second data driving chips are mounted.

14. The method of claim 13, wherein the second printed circuit board is connected to the short side of the thin film transistor board through the second flexible circuit boards.

15. The method of claim 14, wherein
the pixel driving lines on the thin film transistor board of which the short side thereof is connected to the second printed circuit board further comprise a plurality of gate lines,
wherein a gate driving unit comprising the second data driving chips is connected to each of:
the third region circuit connection lines of the second printed circuit board,
the second region circuit connection lines of the first printed circuit board, and
the pixel driving lines of the thin film transistor board connected to the second printed circuit board.

16. The method of claim 1, wherein the forming of the pixel driving lines, the pixels and the circuit connection lines comprises a photolithography process.

17. The method of claim 1, further comprising:
disposing a color filter board so as to be opposed to the thin film transistor board with the pixel driving lines and the pixels thereon; and
disposing a liquid crystal layer between the thin film transistor board with the pixel driving lines and the pixels thereon and the color filter board.

* * * * *